(12) United States Patent
Chen

(10) Patent No.: US 8,941,207 B2
(45) Date of Patent: Jan. 27, 2015

(54) SURFACE (LATERAL) VOLTAGE-SUSTAINING REGION WITH AN INSULATOR FILM CONTAINING CONDUCTIVE PARTICLES

(71) Applicant: Xingbi Chen, Chengdu (CN)

(72) Inventor: Xingbi Chen, Chengdu (CN)

(73) Assignee: University of Electronic Science and Technology, Chengdu, Sichuan (CN)

(*) Notice: Subject to any disclaimer, the term of this patent is extended or adjusted under 35 U.S.C. 154(b) by 35 days.

(21) Appl. No.: 13/739,905

(22) Filed: Jan. 11, 2013

(65) Prior Publication Data
US 2013/0175657 A1   Jul. 11, 2013

(30) Foreign Application Priority Data
Jan. 11, 2012   (CN) .......................... 2012 1 0006353

(51) Int. Cl.
| | | |
|---|---|---|
| H01L 23/58 | (2006.01) | |
| H01L 29/861 | (2006.01) | |
| H01L 31/107 | (2006.01) | |
| H01L 29/06 | (2006.01) | |
| H01L 29/40 | (2006.01) | |
| H01L 29/78 | (2006.01) | |
| H01L 29/94 | (2006.01) | |
| H01L 29/10 | (2006.01) | |

(52) U.S. Cl.
CPC .......... *H01L 29/0615* (2013.01); *H01L 29/408* (2013.01); *H01L 29/7811* (2013.01); *H01L 29/7835* (2013.01); *H01L 29/8611* (2013.01); *H01L 29/94* (2013.01); H01L 29/402 (2013.01); H01L 29/0692 (2013.01); H01L 29/1083 (2013.01)
USPC ............ 257/492; 257/494; 257/605; 257/606

(58) Field of Classification Search
USPC .................................. 257/492, 494, 605, 606
See application file for complete search history.

(56) References Cited

U.S. PATENT DOCUMENTS 6,936,907 B2   8/2005 Chen

FOREIGN PATENT DOCUMENTS

CN   1399348 A   2/2003

OTHER PUBLICATIONS

Chen et al., "Lateral high-voltage devices using an optimized variational lateral doping", International Journal of Electronics, 1996, pp. 449-459, vol. 80, Issue 3, Taylor & Francis, 1996, 1 page (abstract only).
Chen et al., "Theory of optimum design of reverse-biased p-n junctions using resistive field plates and variation lateral doping", Solid-State Electronics, Sep. 1992, pp. 1365-1370, vol. 35, Issue 9, Elsevier Ltd., Sep. 1992, 1 page (abstract only).

*Primary Examiner* — Sonya D McCall Shepard
(74) *Attorney, Agent, or Firm* — Kilpatrick Townsend & Stockton LLP

(57) ABSTRACT

A method or an auxiliary method to implement Optimum Variation Lateral Electric Displacement uses an insulator film(s) containing conductive particles covering on the semiconductor surface. This film(s) is capable of transmitting electric displacement into or extracting it from the semiconductor surface, or even capable of extracting some electric displacement from a part of the semiconductor surface and then transmitting it to another part of the surface. Optimum Variation Lateral Electric Displacement can be used to fabricate lateral high voltage devices, or as the edge termination for vertical high voltage devices, or to make capacitance. It can be further used to prevent strong field at the boundaries of semiconductor regions of different types of conductivity types.

26 Claims, 9 Drawing Sheets

＃ SURFACE (LATERAL) VOLTAGE-SUSTAINING REGION WITH AN INSULATOR FILM CONTAINING CONDUCTIVE PARTICLES

CROSS-REFERENCE TO RELATED APPLICATIONS

This application claims priority to Chinese Patent Application No. 201210006353.3, filed on Jan. 11, 2012 and entitled "Surface Voltage-sustaining Region for Semiconductor Device, Semiconductor Device and Capacitor", which is incorporated herein by reference in its entirety.

BACKGROUND

1. Field of the Invention

The present invention relates to a semiconductor device, particularly to a surface voltage-sustaining region for a lateral high power device and an edge termination for a vertical high voltage device.

2. Description of the Related Art

In Ref. [1], the optimum doping density of the surface voltage-sustaining region (N-type in the following) is disclosed, which has an opposite conductivity type to the substrate. The structure of a diode cell with an interdigitated layout shown in FIG. 1A has the afore mentioned voltage-sustaining region, wherein, 1 represents a P$^-$-type substrate region, 2 represents an N$^+$-type contact region, 3 represents a P$^+$-type contact region, 4 represents an N-type region of the voltage-sustaining region from x=0 to x=L, A stands for the anode, and K stands for the cathode. The solid curve in FIG. 1B indicates the required optimum charge density D of the surface impurities for a maximum breakdown voltage under a distance L. In this figure, $D_0=qN_BW_{pp}$, where q is the electron charge, $N_B$ is the acceptor concentration of the substrate and $W_{pp}$ is the depletion width of a one-sided abrupt parallel plane junction made by the same substrate doping concentration (e.g. P$^-$-type) under its breakdown voltage, thus $D_0$ stands for the charge density of the depletion layer in the N$^+$-type region. The value of L in FIG. 1B is $2W_{pp}$. Under this condition, the breakdown voltage of the voltage-sustaining region can achieve 95% of the one-sided abrupt parallel plane junction with the same substrate doping concentration. The optimum charge density profile demonstrated by the solid curve can be approximated by three piece-wise zones (dashed lines 5, 6 and 7 in FIG. 1B), where each has a constant surface charge density, to obtain a breakdown voltage just a little lower than the case of the solid curve. Under such the optimum variation lateral doping, the corresponding profiles of the lateral surface electric field $E_x$ and the surface potential V are illustrated in FIG. 1C and FIG. 1D, respectively. In these figures, $E_{crit}$ and $V_{Bpp}$ stand for the critical electric field and the breakdown voltage of the one-sided abrupt parallel plane junction with the same substrate doping concentration, respectively. FIG. 1E schematically shows a method to implement approximately the three piece-wise zones of constant surface doping densities. In this figure, there is an N-type region 4 with a uniform doping density in the whole surface voltage-sustaining region, where the charge density is larger than the dashed line 5 shown in FIG. 1B. There is a thin P-type region 8 with uniform doping density covering not totally but partly on the N-type region 4. In the minimum covering section (that is, the section including points A and A'), the net charge density obtained by the charges of donors of the N-type region 4 and that of acceptors of the P-type region 8 is equal to the dashed line 5 in FIG. 1B. In the section, where much more part of the N-type region 4 is covered by the P-type region 8, the net charge density equals the dashed line 6 shown in FIG. 1B. In the right section of FIG. 1E, the N-type region 4 is totally covered by the P-type region 8, the net charge density is equivalent to the dashed line 7 in FIG. 1B. Such a method is a method to use the compensation of different types of dopants at different locations.

It should be noted that the more the number of the piece-wise zones are, the closer the breakdown voltage is to that corresponding to the solid curve case shown in FIG. 1B.

However, it may happen that the appropriate dose of the P-type region 8 and/or the appropriate dose of the N-type region 4 do not exist in a certain CMOS or BiCMOS technology. Besides, in modern deep sub-micron technology, the N-type region 4 is very thin and thus the concentration of donors in this region is very high, which accompanies a low mobility. As a result, the specific on-resistance of a lateral n-MOST by using this technique is very high. Furthermore, if the N-type region 4 is covered by the P-type region 8, the thickness of this N-type region 4 becomes much smaller, which increases the specific on-resistance. Besides, as stated in Ref. [2], when the above method shown in FIG. 1E is used, at the boundary of the P-type region 8 (e.g. at the points A and point A'), there is an electric field parallel to semiconductor surface and perpendicular to the edges of P-type strip 8, which causes a slight decrease of the breakdown voltage.

In the prior work (Ref. [3]), the present inventor proposed a thin film of high permittivity placed on the surface of a semiconductor, where electric displacement lines can be guided from one place to another place of semiconductor surface, which needs some electric displacement. However, high permittivity materials normally have ferro-electricity characteristics, which is only suitable for the devices with voltage varying very slowly. Also, the difficulties are increased when it is required that the high permittivity materials should have the same thermal expansion coefficient with the semiconductor.

REFERENCES

[1] X. B. Chen, et al., "Theory of optimum design of reverse-biased p-n junction using resistive field plates and variation lateral doping", Solid-State Electronics, Vol. 35, No. 8, pp. 1365-1370 (1992).

[2] X. B. Chen, "Lateral high-voltage devices using an optimized variational lateral doping", Int. J. Electronics. Vol. 83, No. 3, pp. 449-459 (1996).

[3] X. B. Chen, U.S. Pat. No. 6,936,907 B2, or Chinese patent ZL 02142183.8.

SUMMARY

The present invention proposes an insulator material containing conductive particles to replace the material with a high permittivity stated above. Since electric moments of conductive particles induced by an external applied electric field are dipoles alike, the insulator material containing conductive particles plays macroscopically a role as a material having a high permittivity (HK). The proposed material is called as Pseudo-HK (PHK) material, which has a fairly high permittivity $\epsilon_I$ macroscopically.

An object of this invention is concerned with using a thin film of insulator containing conductive particles, denoted as "PHK film" hereafter, and placed on the top of the semiconductor surface. The thin film is capable of extracting electric displacement lines from one area of the device, and then introducing them into the semiconductor surface at another area, or, contrary. The insulator material containing conductive particles has a macroscopic permittivity $\epsilon_I$ much larger than the permittivity of semiconductor $\epsilon_S$ The present invention can be summarized by referring the preferred embodiments described as follows.

1. Referring to FIG. 2-6 and FIG. 15-17, a method for fabricating a surface voltage-sustaining region for semiconductor devices is provided. The semiconductor device comprises a semiconductor substrate of a first conductivity type (P$^-$-type region 1) and a region having a highest voltage formed by a metal or by a heavily doped semiconductor region of a second conductivity type (N$^+$-type region 2) in contact with the substrate, and a region having a lowest voltage formed by a metal or by a heavily doped semiconductor region of a first conductivity type (P$^+$-type region 3) in contact with the substrate; the surface voltage-sustaining region is located at the top of the substrate from the region having a highest voltage to the region having a lowest voltage, and contains at least one section of the insulator film containing conductive particles (PHK film 9) on the semiconductor surface; the insulator film containing conductive particles has a permittivity averaged on a scale much larger than the sizes of the particles, called as macroscopic permittivity $\epsilon_I$; the surface voltage-sustaining region transmits a net electric displacement of a first sign to the substrate throughout the surface voltage-sustaining region when a reverse voltage close to the breakdown voltage is applied across the surface voltage-sustaining region, the average electric displacement from the region having a highest voltage to the region having a lowest voltage decreases gradually or stepwisely from a value of $qN_B W_{pp}$, where q is the electron charge, $N_B$ is the impurity concentration of the substrate (P$^-$-type region 1), $W_{pp}$ is the depletion width of a one-sided abrupt parallel plane junction made by the same substrate doping concentration (e.g. P$^-$-type) under its breakdown voltage the electric displacement means the value of the effective amount of the electric displacement fluxes in an area (with a surface lateral distance much smaller than $W_{pp}$ but larger than the thickness of the surface voltage-sustaining region at this area) divided by the area; the thickness of the surface voltage-sustaining region at this area means the thickness of the insulator film containing conductive particles (PHK film 9) plus the thickness of the semiconductor surface layer having different doping from that of the substrate (e.g. N-type region 4 in FIG. 15 and FIG. 17); the sign of the net electric displacement lines of a first sign means the electric displacement lines have the same sign with the electric displacement lines generated by the ionized impurities of a semiconductor of a second conductivity type (e.g. N-type region 4 in FIG. 15 and FIG. 17); the net average electric displacement of a first sign means the average electric displacement of a first sign minus the average electric displacement of a second sign being opposite to the first sign; under the action of the net average electric displacement of a first sign, the surface lateral field in the surface voltage-sustaining region has its minimum value close to zero from the position close to the largest potential (N$^+$-region 2) and increases its magnitude when the position gets close to the smallest potential (P$^+$-region 3); the electric displacement generated by the insulator film containing conductive particles (PHK film 9) means, in a small section at the surface, the value that the surface lateral field at the side nearest to the region having a highest voltage multiplied by the sheet capacitance of this side minus the value that at the side furthest to the region having a highest voltage; the sheet capacitance is the result when the amount of the flux of the lateral component of the vector of the electric displacement in the PHK film is divided by the lateral component of the electric field.

2. Referring to FIG. 16, the surface voltage-sustaining region for semiconductor devices according to the present invention, the insulator film containing conductive particles (PHK film 9) on the semiconductor surface has one or multiple section(s) with a conductor on its top, which can be electrically floating (e.g. the conductor on the PHK film 9 in FIG. 16), in this case, the electric displacement generated by the insulator film containing conductive particles (PHK film 9) is the electric displacement generated by the insulator film containing conductive particles covered by conductor(s), which is the value of the potential at the top of this film minus the potential at the semiconductor surface and then multiplied by the specific capacitance of the insulator film containing conductive particles, the specific capacitance is the electric displacement entering into the semiconductor surface divided by the potential difference between the top of the insulator film containing conductive particles and the semiconductor surface.

3. Referring to FIG. 15 and FIG. 17, the surface voltage-sustaining region for semiconductor devices according to the present invention, the insulator film containing conductive particles (PHK film 9) on the semiconductor surface has one or multiple section(s) with a conductor which can be electrically connected to a voltage terminal outside the surface voltage-sustaining region (e.g., the conductor on the PHK film 9 is connected to the electrode S in FIG. 15 and to the electrode A in FIG. 17), in this case, the electric displacement generated by the insulator film containing conductive particles (PHK film 9) having a conductor covered on its top is the value of a specific capacitance of the insulator film containing conductive particles multiplied by a potential difference, where the potential difference is the potential at the top of this film minus the potential at the semiconductor surface and the specific capacitance is the electric displacement entering into the semiconductor surface divided by the potential difference.

4. Referring to FIG. 4-6 and FIG. 15-17, the surface voltage-sustaining region for semiconductor devices according to the present invention, the surface voltage-sustaining region contains one or multiple section(s) of semiconductor thin layer of a second conductivity type (N-type region 4 in FIG. 4-5 and FIG. 15-17 or N-type regions 14, 15, 16 in FIG. 6) or semiconductor thin layer of a first conductivity type, the concentration and/or the conductivity type of the impurities of the surface thin layer is different from the substrate (P$^-$-type region 1). In this case, the average electric displacement not only includes the electric displacement generated by the ionized impurities in the semiconductor thin layer of the surface voltage-sustaining region, which has a net doping of a second conductivity type or a first conductivity type, but also includes the electric displacement generated by the insulator film containing conductive particles (PHK film 9).

5. Referring to FIG. 1A, FIG. 2-6 and FIG. 15-17, the surface voltage-sustaining region for semiconductor devices according to the present invention, the semiconductor substrate of a first conductivity type is a P-type semiconductor (P$^-$-type region 1), the semiconductor of a second conductivity type is an N-type semiconductor, the sign of the electric displacement lines of a first sign is the same with the sign of the electric displacement lines generated by positive charge, the region having a highest voltage has the highest potential, the region having a lowest voltage has the lowest potential, the surface voltage-sustaining region transmits positive electric displacement fluxes to the substrate everywhere.

6. Referring to FIG. 14, the surface voltage-sustaining region for semiconductor devices according to the present invention, the semiconductor substrate of a first conductivity type is an N-type semiconductor (N-type region 4), the semiconductor of a second conductivity type is a P-type semiconductor, the sign of the electric displacement lines of a first sign is the same with the sign of the electric displacement lines generated by negative charge, the region having a highest voltage has the lowest potential, the region having a lowest voltage has the highest potential, the surface voltage-sustaining region absorbs positive electric displacement fluxes from the substrate everywhere, that is transmits negative electric displacement fluxes to the substrate everywhere.

7. Referring to FIG. 2 and FIG. 3, the surface voltage-sustaining region for semiconductor devices according to the present invention, the sheet capacitance of the insulator film containing conductive particles (PHK film 9) decreases gradually or stepwisely from the region having a highest voltage (N$^+$-type region 2) to the region having a lowest voltage (P$^+$-type region 3).

8. Referring to FIG. 5, the surface voltage-sustaining region for semiconductor devices according to the present invention, the surface voltage-sustaining region has a section of a second conductivity type (N-type region 4) close to the region having a highest voltage (N$^+$-type region 2) having impurity density (the amount of the impurities in unit area) higher than a value of $N_B W_{pp}$; the sheet capacitance of the insulator film containing conductive particles (PHK film 9) decreases gradually or stepwisely from the region having a highest voltage to the region having a lowest voltage (P$^+$-type region 3).

9. Referring to FIG. 4, the surface voltage-sustaining region for semiconductor devices according to the present invention, a semiconductor region of a second conductivity type (N-type region 4) of the voltage-sustaining region having impurity density higher than $N_B W_{pp}$ is located between the region having a highest voltage (N$^+$-type region 2) and the region having a lowest voltage (P$^+$-type region 3); the sheet capacitance of the insulator film containing conductive particles (PHK film 9) increases gradually or stepwisely from the region having a highest voltage; the insulator film containing conductive particles further covers the region connected to the region having a lowest voltage.

10. Referring to FIG. 6, the surface voltage-sustaining region for semiconductor devices according to the present invention, the surface voltage-sustaining region has a section of a second conductivity type having impurity density higher than $N_B W_{pp}$ (N-type region 14 and 15) close to the region having a highest voltage (N$^+$-type region 2); and has a section of semiconductor region close to the region having a lowest voltage (P$^+$-type region 3) having a net doping being a first conductivity type; the sheet capacitance of the insulator film containing conductive particles (PHK film 9) increases gradually or stepwisely from the region having a highest voltage and decreases at the region close to the region having a lowest voltage having a net doping being a first conductivity type.

11. Referring to FIG. 2, the surface voltage-sustaining region for semiconductor devices according to the present invention, a conductor (the bold line of the electrode K) located on the top of a section of the insulator film containing conductive particles (PHK film 9) is close to the region having a highest voltage (N$^+$-type region 2) and connected to it; the specific capacitance in this section decreases gradually or stepwisely from the region having a highest voltage, while the sheet capacitance of the other portion of the insulator film containing conductive particles (PHK film 9) without conductor covering, decreases gradually or stepwisely with the distance toward the region having a lowest voltage.

12. Referring to FIG. 17, the surface voltage-sustaining region for semiconductor devices according to the present invention, a region of a second conductivity type (N-type region 4) of the surface voltage-sustaining having impurity density being higher than $N_B W_{pp}$ is located between the region having a highest voltage (N$^+$-type region 2) and the region having a lowest voltage (P$^+$-type region 3); the insulator film containing conductive particles (PHK film 9) is divided into two regions, at the region close to the region having a highest voltage (the left portion of the PHK film 9), no conductor is placed on its top, and the sheet capacitance in this region increases gradually or stepwisely with the distance from the region having a highest voltage; at the region close to the region having a lowest voltage (the right portion of the PHK film 9), a conductor is placed on its top and connected to the region having a lowest voltage, and the sheet capacitance in this region increases gradually or stepwisely with the distance toward the region having a lowest voltage.

13. Referring to FIG. 2-6 and FIG. 14-16, the surface voltage-sustaining region for semiconductor devices according to the present invention, the thickness of the insulator film containing conductive particles changes gradually or stepwisely with the distance from the region having a highest voltage.

14. Referring to FIG. 10, the surface voltage-sustaining region for semiconductor devices according to the present invention, the rate of covering of the insulator film containing conductive particles changes gradually or stepwisely with the distance from the region having a highest voltage.

15. Referring to FIG. 12, the surface voltage-sustaining region for semiconductor devices according to the present invention, at least one section of the insulator film containing conductive particles consists of materials with different macroscopic permittivity (PHK$_1$ 20, PHK$_2$ 21 and PHK$_3$ 22).

16. Referring to FIG. 13, the surface voltage-sustaining region for semiconductor devices according to the present invention, at least one section of the insulator film containing conductive particles is located on the top of a surface area having a certain distance from the region having a highest voltage.

17. Referring to FIG. 2-6 and FIG. 15-17, a semiconductor device is proposed, having a semiconductor substrate of a first conductivity type and a region having a highest voltage formed by a metal or by a heavily doped semiconductor region of a second conductivity type in contact with the substrate and a region having a lowest voltage formed by a metal or by a heavily doped semiconductor region of a first conductivity type in contact with the substrate; wherein, the surface voltage-sustaining region according to the present invention is located at the top of the substrate from the region having a highest voltage to the region having a lowest voltage.

18. An edge termination outside the active region of the semiconductor device is proposed, wherein a semiconductor substrate of a first conductivity type and a region having a highest voltage formed by a metal or by a heavily doped semiconductor region of a second conductivity type in contact with the substrate and a region having a lowest voltage formed by a metal or by a heavily doped semiconductor region of a first conductivity type in contact with the substrate; a surface voltage-sustaining region according to the present invention is located at the top of the substrate from the region having a highest voltage to the region having a lowest voltage.

19. Referring to FIG. 18, FIG. 20-22, a thin voltage-sustaining region for semiconductor devices is proposed, having a region having a lowest voltage formed by a metal or by a heavily doped semiconductor region of a first conductivity type (P$^+$-type region 3 in FIG. 18 and FIG. 20 or P-type region 24 in FIG. 21 and FIG. 22) and a region having a highest voltage formed by a metal or by a heavily doped semiconductor region of a second conductivity type (N$^+$-type region 2 in FIG. 18 and FIG. 20 or N$^+$-type region 26 in FIG. 21 and FIG. 22); the thin voltage-sustaining region is located between the region having a highest voltage and the region having a lowest voltage, wherein, the thin voltage-sustaining region contains at least one section of the insulator film containing conductive particles (PHK film 9) on the semiconductor surface; when a reverse voltage close to the breakdown voltage is applied across the thin voltage-sustaining region, the thin voltage-sustaining region transmits electric displacement lines to the insulator film containing conductive particles (PHK film 9) everywhere, which is identical to the electric displacement lines generated by the net doping dose; the electric lines transmitted to the insulator film containing conductive particles are eventually absorbed by the metal or by the heavily doped semiconductor region(s) of a first or a second conductivity type through the insulator film containing conductive particles; the field profile in the thin voltage-sustaining region is almost constant.

20. A thin voltage-sustaining region for semiconductor devices according to the present invention, the insulator film containing conductive particles on the semiconductor surface has one or multiple section(s) with a conductor covered on top, the conductor can be electrically floating, the electric displacement lines transmitted to the insulator film containing conductive particles are eventually absorbed by the conductor on the top of the insulator film containing conductive particles and/or by the metal and/or by the heavily doped semiconductor region(s) of a first or a second conductivity type through the insulator film containing conductive particles.

21. Referring to FIG. 18, FIG. 20, FIG. 21 and FIG. 22, the thin voltage-sustaining region for semiconductor devices according to the present invention, the insulator film containing conductive particles on the semiconductor surface has one or multiple section(s) with a conductor (the bold line on the PHK film 9) covered on top, the conductor can be electrically connected to a voltage terminal (the anode A in FIG. 18 and FIG. 20, or the electrode S in FIG. 21, or the electrode D in FIG. 22) outside the surface voltage-sustaining region, the electric displacement transmitted to the insulator film containing conductive particles are eventually absorbed by the conductor on the top of the insulator film containing conductive particles and/or by the metal and/or by the heavily doped semiconductor region(s) of a first or a second conductivity type through the insulator film containing conductive particles.

22. Referring to FIG. 18, FIG. 20, FIG. 21 and FIG. 22, the thin voltage-sustaining region for semiconductor devices according to the present invention, the thin voltage-sustaining region contains at least one or multiple section(s) of thin layers (N-type region 4) with net doping being the first conductivity type or the second conductivity type.

23. Referring to FIG. 20, FIG. 21 and FIG. 22, a semiconductor device having a region having a lowest voltage formed by a metal or by a heavily doped semiconductor region of a first conductivity type (P$^+$-type region 3 in FIG. 20 or P-type region 24 in FIG. 21 and FIG. 22) and a region having a highest voltage formed by a metal or by a heavily doped semiconductor region of a second conductivity type (N$^+$-type region 2 in FIG. 20 or N$^+$-type region 26 in FIG. 21 and FIG. 22) is proposed; wherein, the semiconductor device also has a thin voltage-sustaining region of the semiconductor device described above located between the region having a highest voltage and the region having a lowest voltage.

24. Referring to FIG. 20, FIG. 21 and FIG. 22, a semiconductor device according to the present invention, one side of the thin surface voltage-sustaining region is covered by the insulator film containing conductive particles (PHK film 9), and the other side is in contact with an insulator film (I region 28) with low permittivity and then connected to a thick semi-insulator or a thick insulator layer (S region 27).

25. The semiconductor device according to the present invention, where the two sides of the thin voltage-sustaining region are covered by the insulator films containing conductive particles.

26. Referring to FIG. 23, a capacitor is proposed, one of the two plates of the capacitor is a metal (electrode E) and the other plate is a semiconductor (N$^+$-type region 5), the insulator film containing conductive particles (PHK film 9) is located between the two plates of the capacitor.

The contents of this invention can be explained by the following five examples.

The first example is a diode shown in FIG. 2. It consists of a P$^-$-type substrate 1, an N$^+$-type contact region 2, a P$^+$-type contact region 3 and a PHK film 9. In this figure, A is the anode and K is the cathode. In the surface voltage-sustaining region (from x=0 to x=L) there are no ionized donor, the electric displacement fluxes flowing into the substrate are completely due to the fluxes generated from the cathode K flowing through the PHK film 9 and gradually distributing to the semiconductor surface. The arrow-headed lines in the figure represent electric displacement lines in the PHK film 9. At the places where no conductor is placed on the PHK film 9, the thickness of the PHK film decreases with the distance from K, ensuring the electric displacement fluxes flowing into the substrate decrease with the distance as well.

The second example is shown in FIG. 4. It consists of a P$^-$-type substrate 1, an N$^+$-type contact region 2, a P$^+$-type contact region 3, an N-type drift region 4 and a PHK film 9. In this figure, A is the anode and K is the cathode. In this example, there is already an N-type region 4 at the semiconductor surface, while the electric displacement generated by this N-type region is larger than the maximum value of D in FIG. 1B. Therefore, the function of the PHK film 9 located from x=0 to x=L, is to absorb the fluxes in the N-type region 4 in the place of x>0 these fluxes can be eventually terminated on the top of the P$^+$-type region 3, which is connected to the anode A. The thickness of the PHK film 9 increases with the distance from x=0, resulting a required electric displacement in FIG. 1B is realized in the region beneath the N-type region 4 from x=0 to x=L.

The third example is shown in FIG. 5. It consists of a P$^-$-type substrate 1, an N$^+$-type contact region 2, a P$^+$-type contact region 3, an N-type region 4 and a PHK film 9. In this figure, A is the anode and K is the cathode. In this example, there is already an N-type region 4 at the semiconductor surface from x=0 to x=$d_0$, while the electric displacement generated by this region is larger than the maximum value of D in FIG. 1B. In the section without the N-type region 4 from x=$d_0$ to x=L, there are no ionized donor. The function of the PHK film 9 located from x=0 to x=L is to absorb the fluxes in the N-type region 4 in the place of x≤$d_0$, these fluxes are gradually released at the place of x≥$d_0$ to the substrate. As a result, the electric displacement flowing from the surface voltage-sustaining region to the substrate can meet the requirement shown in FIG. 1B.

The fourth example is shown in FIG. 13. The difference of this figure to the FIG. 1E is that there is a stripe of PHK film 9 covering on an area containing points A and A', resulting some electric displacement generated by the N-type region 4 enter into the PHK film and then flow into the P-type region 8. Consequently, it looks like that, in the place underneath the PHK film 9, the effective donor density of the N-type region 4 is reduced, while the effective acceptor density of the P-type region 8 is also reduced. Therefore, the field component parallel to the semiconductor surface and perpendicular to the strip is much reduced at points A and A'.

The fifth example is shown in FIG. 18. It is an $n^+np^+$ diode, which consists of an $N^+$-type contact region 2, an N-type region 4 and a $P^+$-type contact region 3. The surface voltage-sustaining region contains the N-type region 4, which is covered by a PHK film 9 on its top. A conductor is placed on the top of the whole PHK film 9 and connected to the anode A. The electric displacement lines generated by the ionized donors of the N-type region 4 are almost entirely transmitted through the PHK film 9 and terminated on the top conductor. When a positive voltage is applied to the cathode K with respect to the anode A, the lateral field profile in the N-type region 4 is almost a constant, similar to the field profile in the i-region of an $n^+$-i-$p^+$ diode. Thus, the N-type region is capable to sustain the highest voltage with a high dose of doping and a very short lateral dimension.

BRIEF DESCRIPTION OF THE DRAWINGS

FIG. 1A illustrates a schematic view of a cell of an inter-digitated diode (the voltage-sustaining region locates from x=0 to x=L, K is the cathode, A is the anode);

FIG. 1B illustrates a schematic view of the electric displacement D of surface donors changing over surface distance when the dimension of the surface voltage-sustaining region is $L(=2W_{pp})$ and a breakdown voltage of $0.95V_{Bpp}$ can be sustained across the cathode K and the anode A. ($V_{Bpp}$, $W_{pp}$ and Do are the breakdown voltage, the depletion width and the charge density of the $N^+$-type region of a one-sided abrupt parallel plane junction with a substrate of the same doping concentration $N_B$, respectively, where $D_0=qN_BW_{pp}$ and q is the electron charge);

FIG. 1C illustrates a schematic view of the surface lateral field $E_x$ changing over surface distance under the condition of the surface doping shown in FIG. 1B, where $E_{crit}$ is the critical breakdown electric field of a one-sided abrupt parallel plane junction with a substrate of the same doping concentration $N_B$;

FIG. 1D illustrates the surface potential V when using the surface doping shown in FIG. 1B, where $V_{Bpp}$ is the breakdown voltage of a one-sided abrupt parallel plane junction with a substrate of the same doping concentration $N_B$;

FIG. 1E illustrates an approach to implementing the three piece-wise zones in FIG. 1B by using the compensation of impurities of different types of conductivity on different places.

FIG. 19A illustrates the variation of the lateral electric field $E_x$ versus the distance x for the diode shown in FIG. 18;

FIG. 19B illustrates the variation of the potential V(x) of the surface N-type region versus the distance x, for the diode shown in FIG. 18.

DESCRIPTION OF THE EMBODIMENTS

As stated above, the surface voltage-sustaining region can be regarded as to produce a Variation Lateral Electric Displacement (VLD) emitting to the substrate. An insulator containing conductive particles (called as PHK for simplicity) can help to realize an optimum VLD to substrate.

Figure 1E:
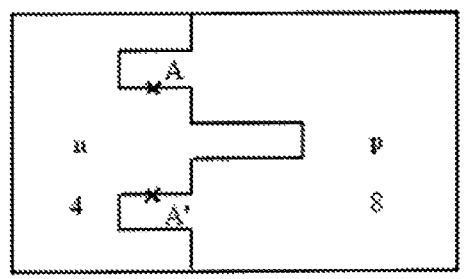
Figure 2:
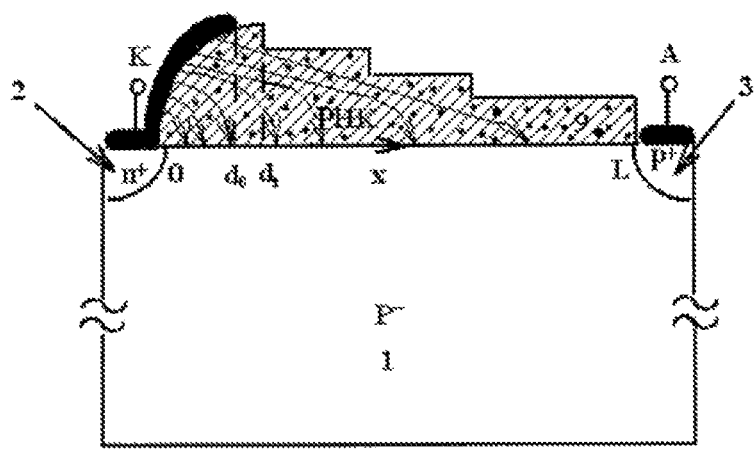
FIG. 2 illustrates an approach for implementing a surface electric displacement close to D shown in FIG. 1B by forming a PHK film on the top of the surface voltage-sustaining region, where the arrow-headed curves represent the flux in the PHK film.

FIG. 2 schematically shows an approach to realize the optimum VLD by using a PHK film 9 with a variable thickness, which covers the surface of the semiconductor surface. The structure shown in this figure is a cell of a high-voltage diode with interdigitated layout. There is no N-type region 4 like shown in FIG. 1E from the N$^+$-type contact region 2 of the cathode K to the P$^+$-type contact region 3 of the anode A. The bold lines stand for electrode contacts and the shaded area containing black spots stands for the PHK film 9. The PHK film 9 has a permittivity $\epsilon_I$, which is much larger than the permittivity of the semiconductor, $\epsilon_S$. The thickness of the PHK film 9 is gradually increased from x=0, the edge of the cathode, to x=$d_1$. In the region of $0 \le x \le d_0$, where $d_0 \le d_1$, there is a conductor covering the top of the PHK film 9 and connected with the cathode K. In this figure, the arrow-headed curves represent the electric displacement lines in the PHK film 9. There are many electric displacement lines flowing out from the part of the PHK film 9 and emitting into the semiconductor in the region $0 \le x \le f_0$. There are also many electric displacement lines flowing out from the PHK film 9 into the semiconductor in the region $d_0 \le x \le L$, where the flux density emitting into the semiconductor decreases with the increasing of x.

Figure 1A:
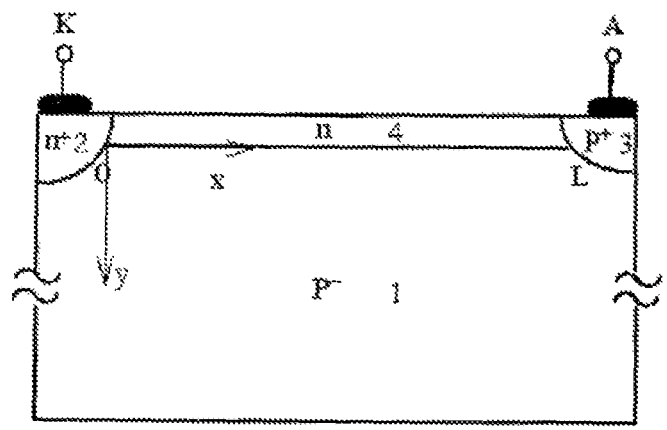
FIGS. 1A, 1B, 1C, 1D and 1E are collectively referred to as FIG. 1, and illustrate the case of an optimum surface voltage-sustaining region formed in a $P^-$-type substrate.
Figure 1B:
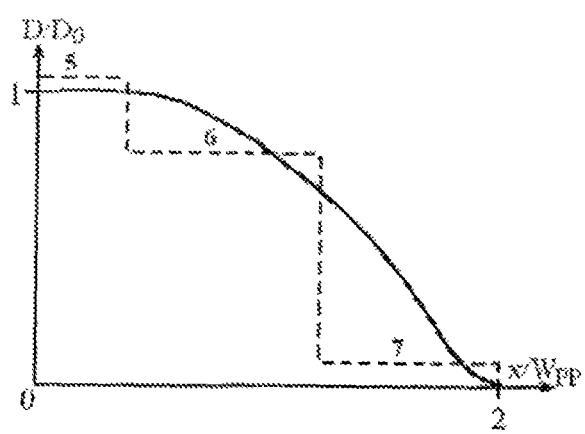

A proper design of the thickness of the PHK film 9 versus x can satisfy the condition that the electric displacement D(x) meets the requirement shown in FIG. 1B.

Figure 3:
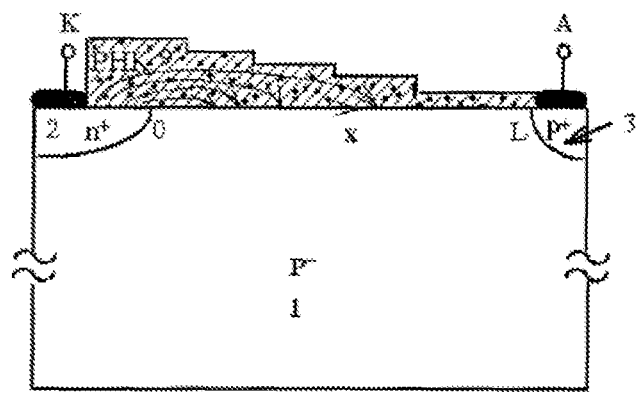
FIG. 3 illustrates another approach for implementing a surface electric displacement close to D shown in FIG. 1B by forming a PHK film on the top of the surface voltage-sustaining region.

FIG. 3 schematically shows another approach to realizing the optimum VLD by using the PHK film 9. In this figure, the part of the PHK film 9 covering the N$^+$-type region 2 connected to the cathode K is very thick. The electric displacement lines flow from this heavily doped region 2, through the PHK film 9, then into the surface of the semiconductor gradually.

Figure 4:
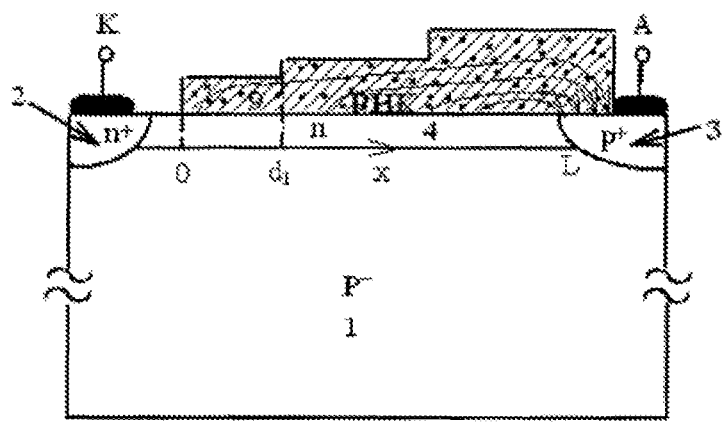
FIG. 4 illustrates a structure by using a PHK film formed on the surface for realizing the effective electric displacement entering into the substrate from the surface decreases with the increasing of x. (In this figure, the donor density of the N-type region exceeds the maximum value required.)

The above two examples are for the case that there is no N-type region 4 on the substrate 1. The required electric displacement entering into the substrate is provided by the insulated film with conductive particles. Actually, if it is necessary, the PHK film can also provide negative flux, that is, an electric displacement flux flowing out from the substrate. FIG. 4 shows an example of this case. In this figure, a thin N-type region 4 is located from the N$^+$-type region 2 contacted to the cathode K up to the P$^+$-type region 3 contacted to the anode A. This N-type region 4 has a larger dose of donors than the maximum dose shown in FIG. 1B. In order to achieve a D(x) shown in FIG. 1B, there is a PHK film 9 with an increasing thickness with the increase of x located on the surface, and the end of the PHK film 9 is connected to the anode A, as shown in FIG. 4.

In FIG. 4, starting from x=0, some electric displacement fluxes flow out from the semiconductor surface and into the PHK film 9. At x=$d_1$, more electric displacement fluxes flow out due to the thicker PHK film 9 here, and the same case occurs at other points with thicker PHK film. The effect of the outgoing electric displacement fluxes is equal to that of a surface P-type region shown in FIG. 1E. As a result, the electric displacement flux flowing from the N-type region 4 into the P$^-$-type substrate decreases with the distance.

Figure 5:
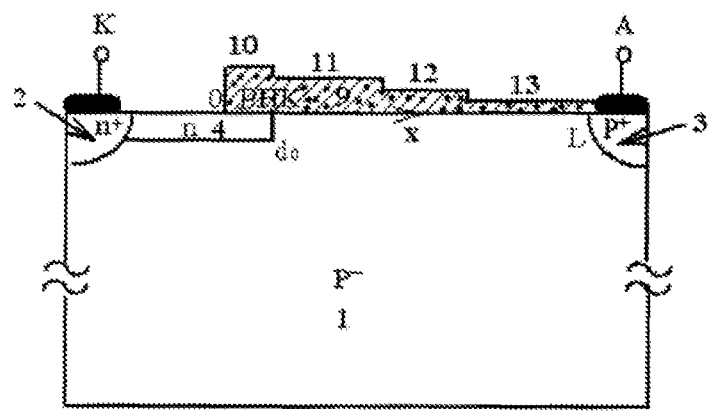
FIG. 5 illustrates the case that a PHK film is used to meet the required optimum electric displacement for the substrate, where the surface has a section with a donor density larger than the maximum value required, whereas the other section has no donors.

In all of the above examples, one end of the PHK film is connected to an electrode or a heavily doped region which is contacted to an electrode. In fact, the PHK film plays a role as absorbing electric displacement fluxes from the semiconductor surface or emitting electric displacement fluxes into the semiconductor surface. FIG. 5 schematically shows another example using the PHK film. In this figure, the N-type region 4 contacted with the cathode K extends from x=0 only up to x=$d_0$. The N$^+$-type region 4 is uniformly doped with a dose can produce a electric displacement larger than the value of the maximum D shown in FIG. 1B, whereas the remaining section without donors can not provide any positive electric displacement fluxes for the substrate. When there is a PHK film covering the semiconductor surface, some positive electric displacement fluxes emitted by the N-type region 4 flow into the section marked 10 of the PHK film. Thus, the flux of the positive electric displacement flows from the N-type region 4 into the substrate at the section marked 11, 12 and 13. A proper design of the physical and geometric parameters of each section can make the profile of the electric displacement flowing into the substrate be approximately satisfied the requirement of the curve shown in FIG. 1B.

Figure 6:
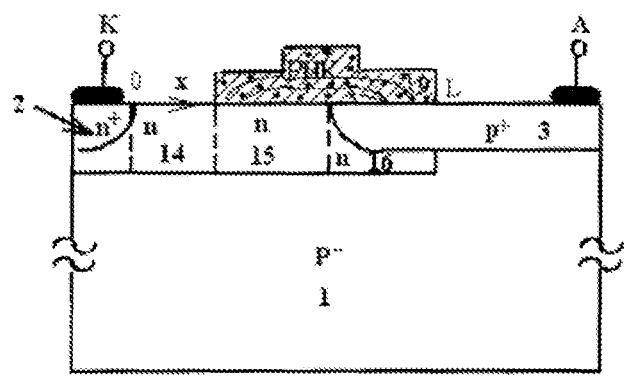
FIG. 6 illustrates the case that a PHK film is used, where the electric displacement of the ionized donors of the surface N-type region is equal to the maximum value shown in FIG. 1B, whereas the electric displacement (negative) of a P-type region partly covering the N-type region exceeds the maximum value shown in FIG. 1B.

Another example using the PHK film is shown in FIG. 6. In this figure, the donor density of the first zone 14 in the N-type region is equal to the required value of the section 5 shown in FIG. 1B. The electric displacement generated by the donor density in the second zone 15 in the N-type region is higher than the required value of the middle section 6 shown in FIG. 1B. The electric displacement generated by the net donor density, resulting from the donor density of the N-type region of the third zone 16 minus the acceptor density of the P$^+$-type region 3 on the top of 16, is lower than the required value of the section 7 shown in FIG. 1B. Since a PHK film 9 is set on the surface in the area of second zone 15 and third zone 16 of the semiconductor, the PHK film 9 absorbs a part of the electric displacement fluxes of the second zone 15 and emits them into the third zone 16. Thus, the surface voltage-sustaining region from x=0 to x=L emits an electric displacement into the P$^-$-type substrate as the stepwise profile shown in FIG. 1B.

For design of the PHK film, the standard numerical calculating software, such as TMA/MEDICI, TMA/DAVINCI and so on, can be used. Some methods for rough estimation are introduced as follows, which can also be used as initial values for the simulation. Two basic principles of the electricity are applied: 1) In the region without space charges, div $\vec{D}$ =0, where $\vec{D}$ is the vector of the electric displacement. Therefore, the electric displacement flux flowing into certain section(s) of the PHK film is equal to the electric displacement flux flowing to the outside of other section(s) of the PHK film. 2) The voltage difference between two points is independent on the paths (that is, curl $\vec{E}=0$, wherein $\vec{E}$ is the vector of the electric field). Thus, at the both sides of any interface between a PHK film and a semiconductor, the components of the electric filed parallel to the interface are equal.

Figure 7:
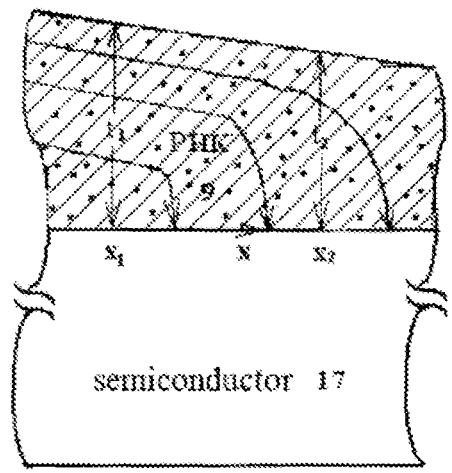
FIG. 7 illustrates a semiconductor structure where the amount of fluxes of electric displacement flowing into the semiconductor from $x_1$ to $x_2$ is equal to the value of the amount of fluxes of electric displacement flowing laterally into the PHK film at $x_1$ minus that amount flowing laterally out of the PHK film at $x_2$.

Assuming the thickness of the PHK film 9 shown in FIG. 7 is varied from $t_1$ at coordinate $x_1$ to $t_2$ at coordinate $x_2$ and the thickness of the PHK film 9 in this section is much smaller than $W_{pp} \cdot (\epsilon_f/\epsilon_S)$, where Wpp is the depletion width of a one-sided abrupt parallel plane junction formed by the same substrate. In a unit distance perpendicular to the paper, the value of the electric displacement flux flowing into the PHK film 9 from the left side of $x=x_1$ is $t_1 D_x(x_1)=t_1 \epsilon_1 E_x(x_1)$ and the value flowing out from $x=x_2$ is $t_2 D_x(x_2)=t_2 \epsilon_f E_x(x_2)$, wherein $E_x$ is the component of E along X-axis. So, the value, $\epsilon_f(t_1 E_x(x_1)-t_2 E_x(x_2))$, is the total flux emitted into the semiconductor 17. According to this formula, for a given value of $E_x(x)$, the value of the thickness of the PHK film at a value of x can be calculated from FIG. 1C and FIG. 1B.

In the present invention, a sheet capacitance $C_\square$ is defined as the value of the lateral amount of the flux of the electric displacement in the PHK film divided by the lateral component of the electric field. Obviously, for a single type of PHK film stated above, the value of $C_\square$ is $C_\square=\epsilon_f t$. And, when $x_1$ gets close to $x_2$, the electric displacement $D_y$ emitted from the PHK film into the semiconductor can be expressed as:

$$D_y = -d(C_\square E_x)/dx \quad (1)$$

Figure 1C:
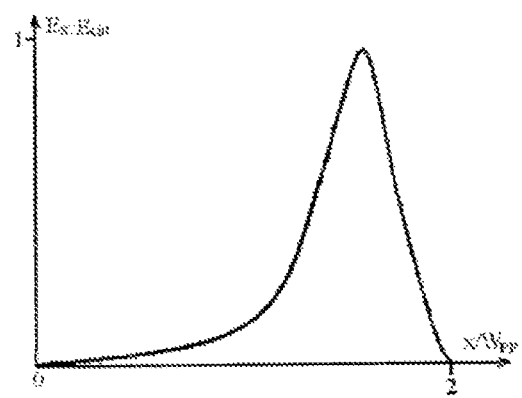

For the place from x=0 to x=L in FIG. 3 and for the place from $x=d_0$ to x=L. in FIG. 2 and FIG. 5, $D_y$ should meet the requirement shown in FIGS. 1B and $E_x$ should meet the requirement shown in FIG. 1C. Thus, the variation of $C_\square$ with the distance can be derived. In fact, when $C_\square$ has a decreasing with increasing of the distance x, which exceeds the effect causing by the increasing of $E_x$ with x, a sufficient positive $D_y$ can be ensured.

For the place from x=0 to x=L in FIG. 4 and the place from x=0 to $x=d_0$ in FIG. 5, $D_y$ emitted from the PHK film 9 should be negative, due to that the electric displacement $D_n$, emitted from the N-type region 4 is already larger than the maximum value shown in FIG. 1B, which is about $1.1 D_0$. The value of $D_y$ is equal to the value of $D_n$, minus the value of D in FIG. 1B. A proper increase of $C_\square$ with distance can provide a required negative value for $D_y$.

Figure 1D:
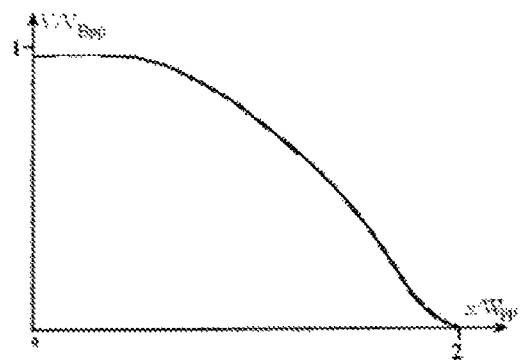
Figure 8:
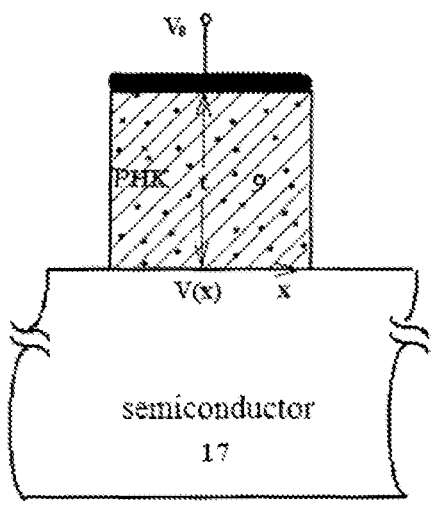
FIG. 8 illustrates a cross-section view of a semiconductor structure, where a section of the PHK film is covered by a conductor, which is connected to a certain electric potential $V_0$.

The examples discussed above do not have a conductor on the top of the PHK film. An example shown in FIG. 8, where a conductor is on the top of a PHK film and connected to a potential $V_0$ and the PHK film has no other PHK film to contact with is discussed as follows. Assuming that, the ideal potential of the semiconductor surface determined from FIG. 1D is V(x), and the required electric displacement flowing into the surface should be $D_y(x)$. Then the thickness t of the PHK film at x has an approximate value of $\epsilon_f(V_0-V(x))/t=D_y(x)$, or $t=\epsilon_f(V_0-V(x))/D_y(x)$.

In the present invention, a specific capacitance $C_v$ of the PHK film is defined as the quotient of the electric displacement entering into the semiconductor divided by the potential difference between the electrode and the semiconductor surface. For the example of only one single type of PHK film stated above, the value of $C_v$ is $C_v=\epsilon_f/t$. From the definition of Cv, the formula $t=\epsilon_f(V_0-V(x))/D_y(x)$ can be expressed as:

$$D_{y(x)} = C_v(V_0-V(x)) \quad (2)$$

Figure 9:
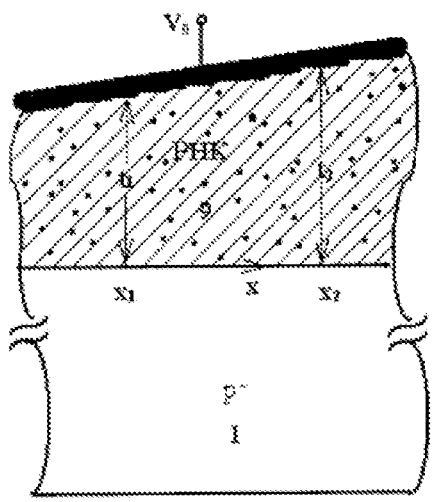
FIG. 9 illustrates a cross-section view of a semiconductor structure, where a section of the PHK film with varying thickness is covered by a conductor on its top, which is connected to a certain electric potential $V_0$.

In FIG. 9, a conductor is formed on the PHK film 9 and connected to a potential $V_0$. The thickness of the PHK film 9 is not uniform. The design of this case is complicated. Assuming the thickness at $x_1$ is $t_1$, and at $x_2$ is $t_2$, a rough estimation of $t_1$ and $t_2$ is as follows.

From $x_1$ to $x_2$ on the semiconductor surface, there are two sources of the electric displacement fluxes entering into the semiconductor. One is the electric displacement fluxes generated from the conductor on the top of the PHK film 9. The other is the fluxes flowing into the PHK film 9 from the left side of $x=x_1$ minus the fluxes flowing out from the side of $x=x_2$.

The electric displacement fluxes perpendicular to the semiconductor surface, emitted from the conductor on the top of the PHK film 9, can be determined by the vertical electric field on the surface. The values of this vertical field $E_y'$ at $x_1$ and $x_2$ can be approximated by $E_y'(x1)=(V_0-V(x_1))/t_1$, and $E_y'(x_2)=(V_0-V(x_2))/t_2$. Thus the electric displacement at these two points are $\epsilon_f E_y'(x_1)$ and $\epsilon_f E_y'(x_2)$, respectively, and the average value of the fluxes in the section starting from $x_1$ to $x_2$ is $[\epsilon_f E_y'(x_1)+\epsilon_f E_y'(x_2)]/2$.

Actually, the electric field perpendicular to the semiconductor surface, $E_y'$, mentioned above is a component of the electric field at the top of the PHK film 9. This field at the top of the PHK film 9 is perpendicular to the conductor. There is an angle $\theta_0$ between the top surface of the conductor and the semiconductor surface. This angle can be determined by the relation $\tan \theta_0=(t_2-t_1)/(x_2-x_1)$. Assuming the field at the top is E', then the vertical component $E_y'$ of E' is $E_y'=E' \cos \theta_0$. There is also a component of E' along X-axis, which is equal to $E_x'=E' \sin \theta_0$. Obviously, it can be concluded that $E_x'=E_y' \tan \theta_0$.

Since the parallel electric field $E_x$ at the semiconductor surface can be determined by FIG. 1C, the electric field parallel to the semiconductor surface at $x=x_1$ varies from a value of $E_x$ at the bottom of the PHK film 9 to a value of $E_x'$ at the top of the PHK film 9, which produces an average value of $(E_x+E_x')/2$. And the two average values at $x_1$ and $x_2$ are $[E_x'(x_1)+E_x'(x_1)]/2$ and $[E_x(x_2)+E_x'(x_2)]/2$, respectively. Therefore, the electric displacement fluxes flowing into the PHK film 9 from the left side of $x=x_1$ is $\epsilon_1 t_1[E_x(x_1)+E_x'(x_1)]/2$, and the fluxes flowing out from $x=x_2$ is $\epsilon_f t_2[E_x(x_2)+E_x'(x_2)]/2$. The difference of these two fluxes of the electric displacement divided by $(x_2-x_1)$ should be the electric displacement generated from the electric field parallel to the semiconductor surface and emitted into the semiconductor.

Figure 10:
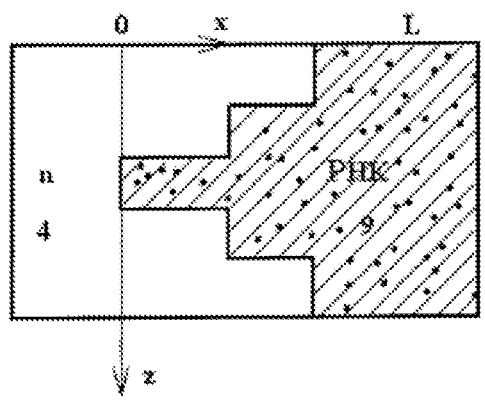
FIG. 10 illustrates a top view of the semiconductor structure showing that by using a variation of the rate of covering of the PHK film to substitute the variation of the thickness of the PHK film.

In the above examples, the required electric displacement flowing into the semiconductor surface is achieved by using the PHK film with a variation of the thickness of the film. As indicated in U.S. Pat. No. 5,726,469 and U.S. Pat. No. 6,310,365 B1, the required electric displacement is an average value taken in an area having a dimension much smaller than $W_{PP}$, which is the depletion width of a one-sided abrupt parallel plane junction formed by the same substrate under its breakdown voltage. Therefore, the method which the PHK film is formed on different parts of the surface can be used instead of a variation of its thickness. FIG. 10 shows such a method for substituting the structure of the PHK film in FIG. 4. This figure is a top view of the PHK film in a cell. If the thickness of the PHK film is a constant t, then the rightmost section is equal to a PHK film with a uniform thickness t, whereas the middle section is equal to a PHK film with a thickness smaller than t, and the left section has an even smaller equivalent thickness than the middle. The equivalent thickness of the PHK film can be considered as the rate of the occupied area along the Z-Axis multiplied by its thickness t.

The discussion in the last paragraph can also be illustrated in terms of the sheet capacitance $C_\square$. The sheet capacitance of the PHK film 9 shown in FIG. 4 increases with x. And the area of the PHK film gradually expands, which means the equivalent (or the average) of $C_\square$ increases with x. Thus, the PHK films in FIG. 4 and FIG. 10 play the same role to the fluxes of electric displacement.

For the case that a conductor is formed on the top of PHK film and connected to a potential $V_0$, the calculation of the equivalent thickness of the PHK film is different from what is stated in the above. In the region with a low rate of occupied area, the average value of electric displacement lines generated from the top of the PHK film decreases, which is equivalent to a thicker PHK film. From the viewpoint of the specific capacitance, in the region with a low rate of occupied area, the number of parallel specific capacitance decreases, thus the average specific capacitance decreases. This is corresponding to an increase of the thickness of a PHK film covering the whole top of the semiconductor surface.

In summary, the flux of the electric displacement entering into the semiconductor can be adjusted by a variation of the pattern of the PHK film.

Figure 11:
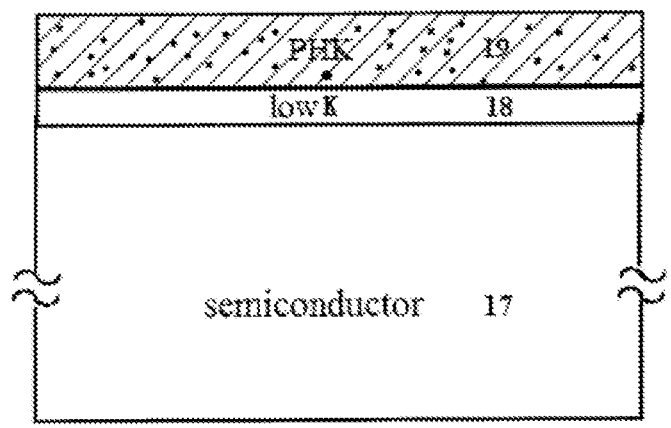
FIG. 11 illustrates a cross-section view of a semiconductor structure, having a PHK film connected to a semiconductor through a low permittivity (LK) film.

Note that the PHK film is not confined to one kind of material, but can be composed of several kinds of materials. Furthermore, the semiconductor can be firstly covered by a thin layer of low permittivity material (e.g. a $SiO_2$ layer on Si), and then covered by one or multiple insulator layer(s) containing conductive particles. If the thickness of the layer of low permittivity material is much smaller than that of the insulator layer(s) containing conductive particles, this layer of low permittivity does not have a strong effect on the electric displacement fluxes flowing between the insulator film(s) containing conductive particles and the semiconductor surface. FIG. 11 shows an example, where a thin layer 18 of low permittivity is formed directly on the semiconductor surface 17, and an insulator layer 19 containing conductive particles is formed on the top of the thin layer 18.

The expression of the sheet capacitance $C_\square$ in (1) for a multiple layers of PHK films without a conductor on the top can be written as:

$$C_\square = \Sigma_{i=1}^n C_{\square i}$$

where $C_{\square i} = \epsilon_{fi} t_i$
where the thickness and permittivity of each layer are denoted by $t_i$ and $\epsilon_{fi}$, respectively, and the number of layers is n.

If a conductor is placed on the top, the effective specific capacitance $C_v$ can be expressed as:

$$\frac{1}{C_v} = \sum \frac{1}{C_{vi}}$$

where $C_{vi} = \epsilon_{fi}/t_i$.

Figure 12:
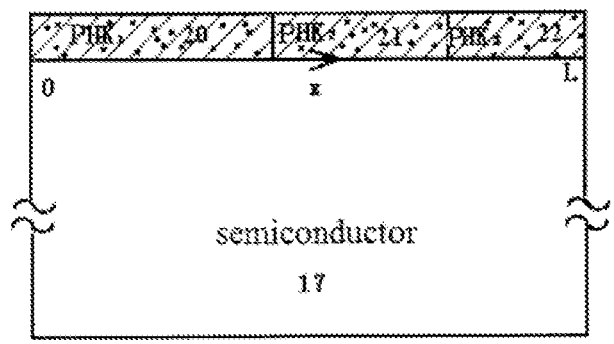
FIG. 12 illustrates a cross-section view of a semiconductor structure having a PHK film consists of three sections, each of which has different value of permittivity ($PHK_1$, $PHK_2$ and $PHK_3$). The permittivity increases in that order.

The PHK film can also consist of several materials. FIG. 12 shows a substitution of the PHK film in FIG. 14. Here, three PHK films 20, 21, and 22 are used, where $\epsilon_3 > \epsilon_2 > \epsilon_1$. When $\epsilon_1$, $\epsilon_2$, $\epsilon_3$ and the width of each PHK film are chosen appropriately, these three films can have the same thickness.

Figure 13:
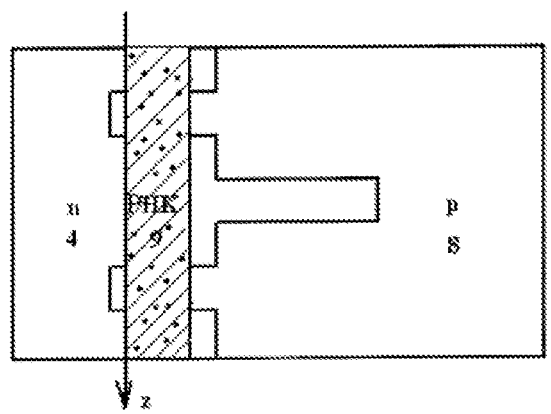
FIG. 13 illustrates a stripe of PHK film placed on a region containing points A and A' in FIG. 1E to reduce the field parallel to the semiconductor surface and perpendicular to the P-type stripe.

Another application of the PHK film is to eliminate or relieve the peak of electric field. FIG. 13 shows a method to reduce the field components parallel to the semiconductor surface and perpendicular to the P-type strip 5 at points A and A' in FIG. 1E. A strip of PHK film 9 in z-direction, the shaded area in the figure, is placed at the top of the semiconductor surface. The PHK film 9 absorbs some positive electric displacement fluxes at the region of the top of the N-type region 4 covered by the film 9, while transmits these fluxes at the region of the top of the P-type region 8 covered by the film 9. Consequently, it looks like that both the effective donor density of the N-region 4 and the effective acceptor density of the P-type region 8 have been decreased at the region covered by the film 9. Therefore, the field component along z-axis decreases significantly.

In the foregoing specification, the examples given are formed on a P-type substrate. However, one of ordinary skill in the art appreciates that this technique may be readily used with an N-type substrate.

Figure 14:
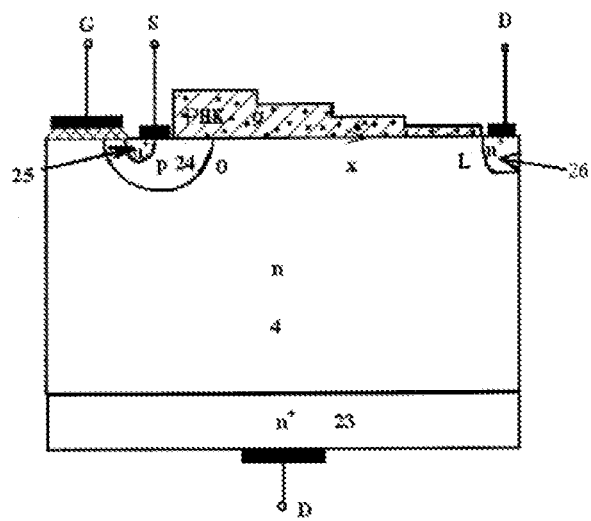
FIG. 14 illustrates a cross-section view of an n-VDMOST using the VLD (Variation Lateral Electric Displacement) technique as its edge termination.

The surface voltage-sustaining regions above mentioned can be used for many devices. It is evident that such a region can be used as the edge termination technique of vertical devices. FIG. 14 shows a cross-section of an n-VDMOST using this voltage-sustaining region as its edge termination. In this figure, the structure is composed of an $N^+$-type drain region 23, a P-type source substrate region 24, an $N^+$-type source contact region 25, an $N^+$-type drain contact region 26, an N-type drift region 4 of the n-VDMOST and a PHK film 9 with a variation thickness, where G is the gate electrode, D is the drain electrode, S is the source electrode. The surface voltage-sustaining region uses a similar method shown in FIG. 3, where the only difference is that all P-regions and N-regions are exchanged.

Figure 15:
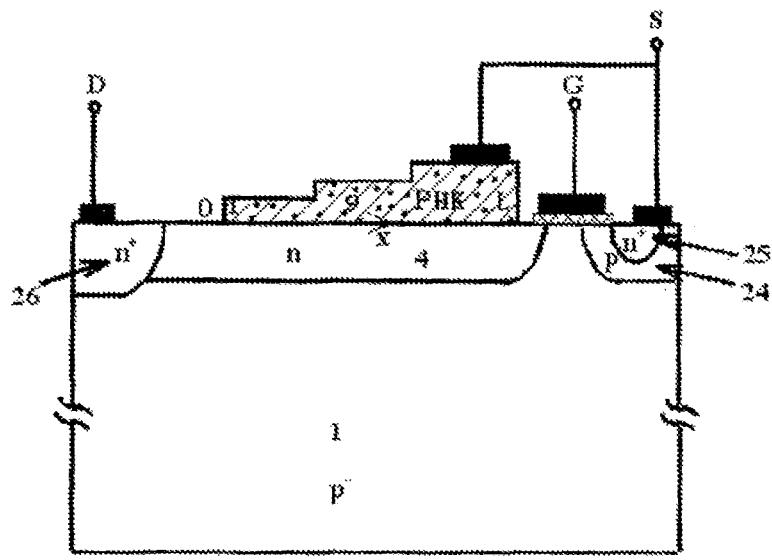
FIG. 15 illustrates a cross-section view of a lateral n-MOST having the surface voltage-sustaining region of FIG. 4.

For lateral (surface) devices, the examples given above are only diodes. FIG. 15 shows a cross-section of a lateral n-MOST using the voltage-sustaining region shown in FIG. 4. In this figure, the structure is composed of a $P^-$-type substrate 1, a P-type source substrate region 24, an $N^+$-type source region 25, an $N^+$-type drain contact region 26, an N-type drift region 4 of the lateral n-MOST and a PHK film 9 with a variation thickness, where G is the gate electrode, D is the drain electrode, S is the source electrode, the crossed shaded area between the gate and the semiconductor is a gate insulator. The surface voltage-sustaining region starts from x=0 to x=L. And the rightmost section of the PHK film is connected to the source electrode through a conductor, which in turn is connected to the substrate.

Figure 16:
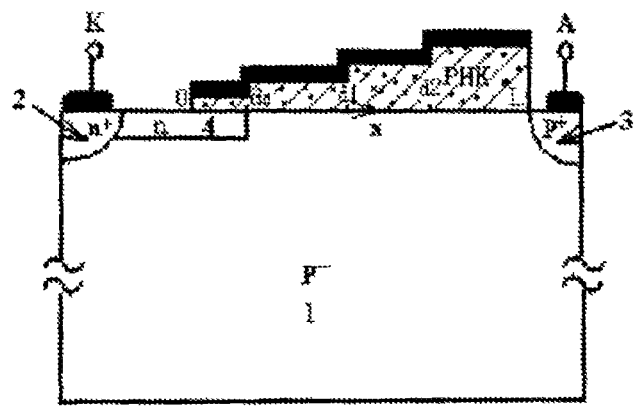
FIG. 16 illustrates a cross-section view of a semiconductor structure, where a floating electrode formed on the top of the PHK film is used to realize the required VLD.

FIG. 16 shows an example to use a floating electrode on the top of the PHK film to realize the required VLD. Here, the semiconductor underneath the PHK film is the same as that in FIG. 5. Assuming the potential of the floating electrode is $V_{f1}$, in the region from x=0 to x=$d_0$, the electric displacement fluxes generated from the semiconductor flow through the PHK film and then are absorbed by the electrode at the top of the PHK film. Whereas in the region x≥$d_0$, electric displacement fluxes are generated from the electrode at the top of the PHK film, then flow into the semiconductor through the PHK film. An approximate method for calculating the physical and the geometrical parameters of the PHK film is as follows. Assuming the average potential of the semiconductor surface in the portion from x=0 to x=$d_0$ is $V_0$, in the portion from x=$d_0$ to x=$d_1$ is $V_1$, in the portion from x=$d_1$ to x=$d_2$ is $V_2$, in the portion from x=$d_2$ to x=$d_3$ (=L) is $V_3$, and the specific capacitances of the PHK film of the three portions are $C_{v0}$, $C_{v1}$, $C_{v2}$, $C_{v3}$, respectively. Further, assuming the required average electric displacement of each portions entering into the semiconductor surface are $D_0$ (in fact, $D_0$ is negative), $D_1$, $D_2$ and $D_3$, respectively. Then the relationship between these parameters is:

$$(V_{f1} - V_i)C_{vi} = D_i, \quad i=0,1,2,3 \tag{3}$$

The total amount of the fluxes generated from the floating electrode should be zero, that is $$\Sigma_{i=0}^3 D_i(d_i - d_{i-1}) = 0, \quad d_{-1} = 0 \tag{4}$$

Actually, from the required $D_i$, $V_i$ and the given values of $d_i$ one can derive the values of Vf1 and Cvi by using the equations (3) and (4).

Figure 17:
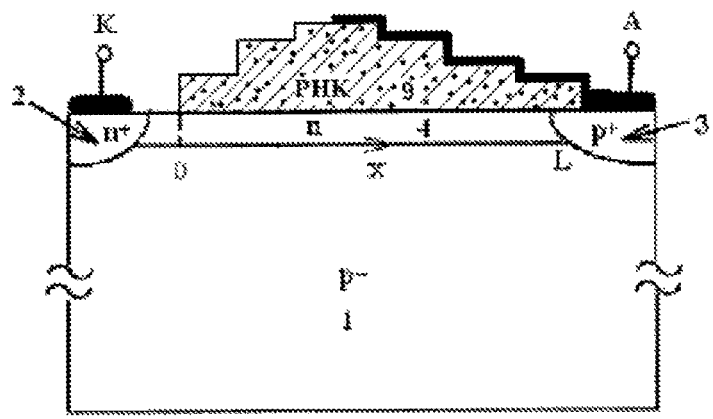
FIG. 17 illustrates a cross-section view of a semiconductor structure, where a conductor formed on a portion of the top of the PHK film and connected to the anode A is used to realize the required VLD.

FIG. 17 shows a semiconductor structure, where a conductor is formed on a portion of the top of the PHK film and connected to the anode A. Here, the semiconductor underneath the PHK film is the same as that in FIG. 4, where the donor density of the thin N-type layer 4 is larger than the maximum value shown in FIG. 1B. From the region x=0, there are some fluxes of electric displacement flowing from the semiconductor surface into the PHK film, then into the conductor on the top of the PHK film. More electric displacement fluxes flow from the region with a larger x. The outgoing fluxes are equivalent to a P-type region formed on the semiconductor surface. The result is the electric displacement fluxes flowing from the N-type region 4 into the P$^-$-substrate decrease with distance, as shown in FIG. 1B.

Figure 18:
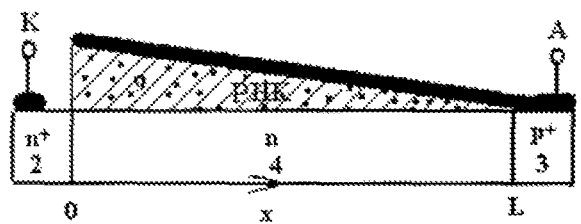
FIG. 18 illustrates a cross-section view of a diode with a thin N-type voltage-sustaining region and without a $P^-$-type substrate, where a conductor is formed on the whole top of the PHK film and connected to the anode A.
Figure 19A:
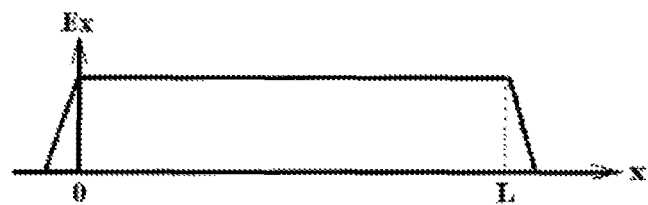
FIGS. 19A and 19B are collectively referred to as FIG. 19 and illustrate the variation of the ideal lateral electric field $E_x$ and the potential V(x) versus the distance x for the diode shown in FIG. 18 under a voltage $V_K$ applied across the cathode K and the anode A, where
Figure 19B:
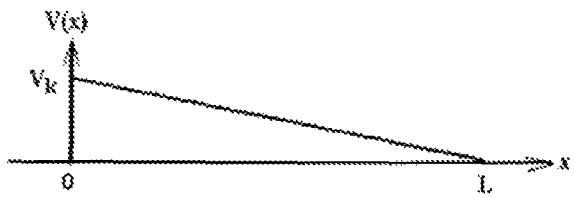

The optimum surface electric displacement presented heretofore is for a surface voltage-sustaining acting as a source of the electric displacement to the substrate, which meets the requirement of FIG. 1B. Actually, the principle of this invention can also be applied to other cases. FIG. 18 shows an example of an n$^+$np$^+$ diode, which has no substrate below. A thin N-type region 4 is located between the N$^+$-type region 2 which is connected to the cathode K and a P$^+$-type region 3 which is connected to the anode A. If one desires the thin N-type region can sustain a high voltage, then the electric displacement lines generated by the donors of the thin region 4 should be absorbed by the PHK film. When a positive voltage is applied to the cathode K with respect to the anode A, the electric field component along the x direction, shown in FIG. 19A, is a constant, which is similar to an n$^+$-i-p$^+$ diode. The potential distribution in the N-type region is shown in FIG. 19B.

If the electric displacement per unit area generated by the ionized donor in the thin N-type layer 4 is $D_n$, all of which should be absorbed by the conductor formed on the top of the film and connected to the electrode K. Then at any abscissa of x:

$$D_n = \epsilon_I V_x / t_x$$

where $V_x$ is the potential at the point x in the N-type region, and $t_x$ and $\epsilon_I$ are the thickness and the permittivity of the PHK film at x, respectively.

Since the required $V_x$ can be expressed as $V_K(1-x/L)$, where L is the length of the N-type region 4. When the donor density of the N-type region 4 is uniform, it is evident from the above equation that, $t_x = t_m(1-x/L)$, where $t_M$ stands for the maximum thickness of the PHK film.

In the above derivation, the electric displacement lines at the bottom of the N-type region 4 are assumed to be absorbed equally by the top electrode through the PHK film as that at the top. Actually, for the fluxes from the bottom of the N-type region 4 to the top electrode, it can be considered that there are two capacitances in series connection: one is $\epsilon_I/t_x$, and the other is $\epsilon_s/d$, where d is the thickness of the N-type region. As far as $\epsilon_s/d \gg \epsilon_I/t_x$, the above derivation is acceptable. Otherwise, one needs to revise the calculation of $t_x$.

Figure 20:
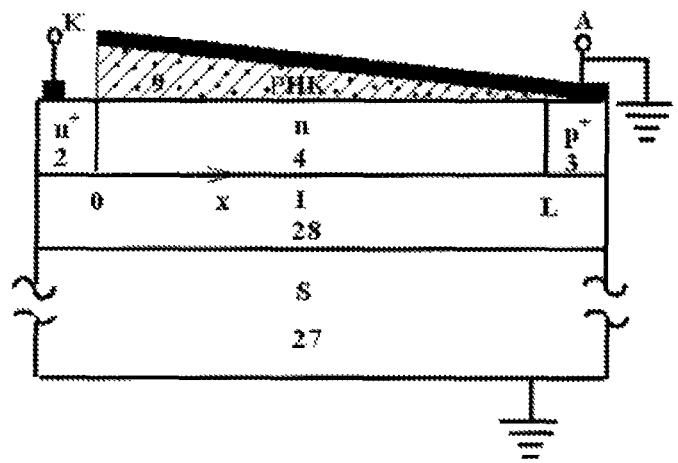
FIG. 20 illustrates a cross-section view of a diode by using the technique of SIS, where a conductor is formed on the whole top of the PHK film and connected to the anode A.

FIG. 18 shows an example, where no electric displacement flux generated by the donors of the N-type region is generated down from the bottom of the N-type region. A practical case is an SIS structure, where a thin semiconductor layer (S) is formed on an insulator layer (I) and the insulator layer is in turn formed on a semiconductor (S). As shown in FIG. 20, when the S-layer 27 is silicon, the I-layer is usually a thick SiO$_2$ layer 28. Because the permittivity of SiO$_2$ is a third of that of Si, few electric displacement lines generated by the donors of the N-type region are emitted down from the bottom of the N-type region into the substrate. The derivation given above can be used as an approximation.

Figure 21:
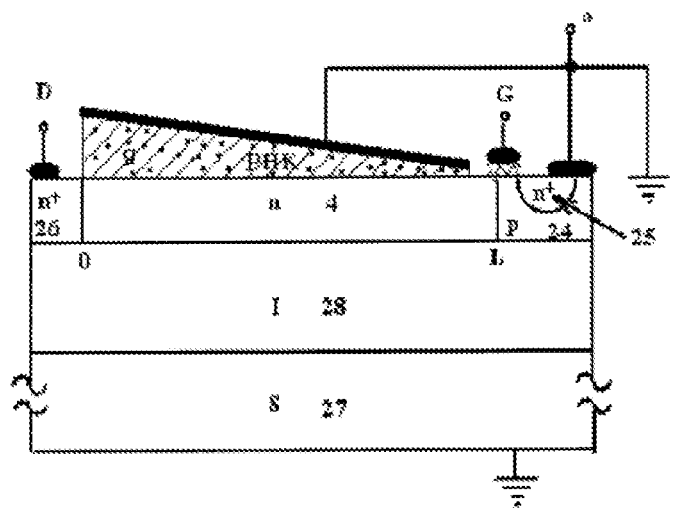
FIG. 21 illustrates a cross-section view of a lateral MOST, by using the surface voltage-sustaining region shown in FIG. 20.

FIG. 21 shows an example by using the surface voltage-sustaining region in FIG. 20 to implement a lateral MOST. The device consists of a S-layer 27, an I-layer 28, an N-type region 4, an N$^+$-type source region 25, a P-type source substrate region 24, an N$^+$-type drain region 26, and a PHK film 9 with a variation thickness, where G is the gate electrode and a thin insulator layer is located underneath the gate. Except for the PHK film placed on the surface of the N-type drift region 4 and the conductor on the top of the PHK film connected to the source electrode, this structure is the same with the normal lateral MOST based on SIS.

Figure 22:
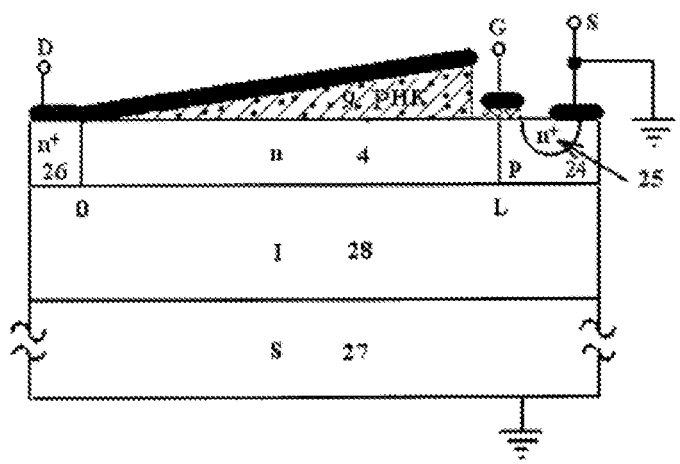
FIG. 22 illustrates a cross-section view of a lateral MOST by using the technique of SIS, where a conductor is formed on the whole top of the PHK film and connected to the drain electrode.

It should be noted that the above principle can also be applied to the case where the top conductor on the PHK film being connected to K in FIG. 18 or to D in FIG. 21. Then, the thickness of the PHK film should be increased with the distance from K or D. FIG. 22 shows a lateral MOST using such connection. This MOST consists of a S-layer, 27, an I-layer 28, an N-type region 4, an N$^+$-type source region 25, a P-type source substrate region 24, an N$^+$-type drain region 26 and a PHK film 9 with a variation thickness. Where, G is the gate electrode, S is the source electrode and D is the drain electrode.

By using the structure shown in FIG. 21 or FIG. 22, a lateral MOST having a very short and highly doped drift region is implemented, for obtaining a very low specific on-resistance and sustaining a very high breakdown voltage.

The example shown in FIG. 18 is that a PHK film is placed on one side of the voltage-sustaining region of a semiconductor device. Naturally, a PHK film can also placed on the other side of the voltage-sustaining region (the bottom surface in FIG. 18). If the PHK film on the bottom surface is covered by a conductor, which is connected to the N$^+$-type region 2, then the specific capacitance of the PHK film should be decreasing with the distance from the N$^+$-type region 2. If the PHK film on the bottom surface is covered by a conductor, which is connected to the P$^+$-type region 3, then the specific capacitance of the PHK film should be increasing with the distance from the N$^+$-type region 2.

Figure 23:
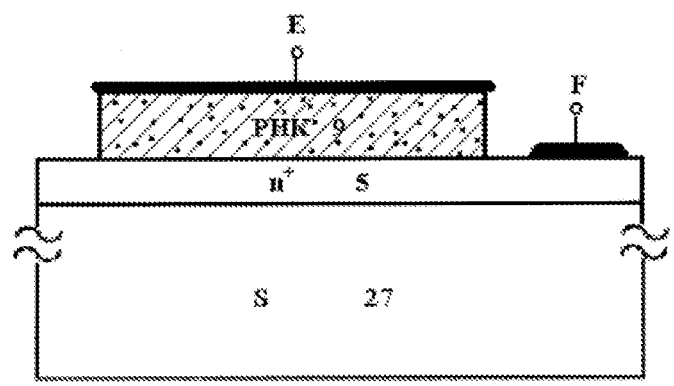
FIG. 23 illustrates a cross-section view of a MIS capacitor, where a PHK film is used to act as an Insulator layer (I-layer).

Besides, sometimes a MIS capacitor with a small area is necessary in an IC, which can be achieved by using the PHK material instead of the I-layer of the MIS capacitor. FIG. 23 shows an example of this method. Where a heavily doped N$^+$-type region 5 is placed on the semiconductor substrate region S 27, and in turn connected to an electrode F, which is the first plate of this MIS capacitance; a metal layer is located on the PHK material 9, and in turn connected to an electrode F, which is the other plate of this MIS capacitor.

Although two types of devices and one edge termination technique have been illustrated for the description of the embodiments of this invention, a person skilled in the art can extend the usage of this invention to other devices.

What is claimed is:

1. A surface voltage-sustaining region for a semiconductor device, said semiconductor device comprising a semiconductor substrate of a first conductivity type and a region having a highest voltage formed by a metal or a heavily doped semiconductor region of a second conductivity type in contact with said substrate and a region having a lowest voltage formed by a metal or a heavily doped semiconductor region of first conductivity type in contact with said substrate;
   said surface voltage-sustaining region is located at the top of said substrate, starting from said region having a highest voltage up to said region having a lowest voltage, wherein:
   said surface voltage-sustaining region contains at least one section of an insulator film containing conductive particles covering on a surface of said semiconductor; and said insulator film containing conductive particles has an average permittivity in a region larger than the dimension of the conductive particles; said average permittivity is named as macroscopic permittivity $\epsilon_f$;

said surface voltage-sustaining region transmits net average electric displacement of a first sign to said substrate everywhere when a reverse voltage close to the breakdown voltage is applied across said region having a highest voltage and said region having a lowest voltage; an net average electric displacement of a first sign starting from said region having a highest voltage with a value of $qN_BW_{pp}$ decreases towards said region having a lowest voltage gradually or stepwisely, where q is the electron charge, $N_B$ is the impurity concentration of said substrate, $W_{pp}$ is the depletion width under the breakdown voltage of a reverse-biased one-sided abrupt parallel plane junction formed by said substrate, wherein said net average electric displacement of a first sign means the value of the effective amount of fluxes of said electric displacement of a first sign in an area having a surface lateral dimension much smaller than $W_{pp}$ but larger than the thickness of said surface voltage-sustaining region; and the thickness of said surface voltage-sustaining region means a sum of the thickness of said insulator film containing conductive particles in this area and the thickness of said semiconductor surface layer in this area, which is doped differently from said substrate;

the sign of said net average electric displacement of a first sign means said net average electric displacement have the same sign as that of electric displacement generated by ionized impurities of a semiconductor of second conductivity type;

said net average electric displacement of a first sign means the average electric displacement of a first sign minus the average electric displacement of a second sign which is opposite to the first sign;

under the action of said net average electric displacement of a first sign, the surface lateral field in said surface voltage-sustaining region has its minimum value close to zero at said region having a highest voltage and increases its magnitude gradually or stepwisely when said position gets close to said region having a lowest voltage;

under the condition that no conductor covered on said insulator film containing conductive particles, said net average electric displacement of a first sign generated by said insulator film containing conductive particles means, in a small section at said surface, a value which is a result of that the surface lateral field at a side nearest to said region having a highest voltage multiplied by a sheet capacitance of this side minus the surface lateral field at a side furthest to said region having a highest voltage multiplied by a sheet capacitance of the furthest side;

said sheet capacitance is a result of a component parallel to said surface of semiconductor of the amount of the vector of fluxes of net average electric displacement of a first sign in said insulator film containing conductive particles divided by a component parallel to said surface of semiconductor of the electric field.

2. A surface voltage-sustaining region for a semiconductor device according to claim 1, wherein said insulator film containing conductive particles covering said surface of semiconductor further comprises one or more sections with a conductor thereon; said conductor is electrically floating; the net average electric displacement of a first sign transmitted into a place of surface of semiconductor through said insulator film containing conductive particles is the value of the potential at the top of this film minus the potential at said place of surface of semiconductor and then multiplied by a specific capacitance of said insulator film containing conductive particles;

said specific capacitance is the net average electric displacement of a first sign entering into said place of surface of semiconductor divided by the potential difference between the top of said insulator film containing conductive particles and said place of surface of semiconductor.

3. A surface voltage-sustaining region for a semiconductor device according to claim 1, wherein said insulator film containing conductive particles covering said surface of semiconductor further comprises one or more sections each covered by a conductor on its top, wherein said conductor can be electrically connected to a voltage terminal outside said surface voltage-sustaining region, the net average electric displacement of a first sign transmitted into a place of surface of semiconductor through said insulator film containing conductive particles is the value of the potential at the top of this film minus the potential at said place of surface of semiconductor and then multiplied by the specific capacitance of said insulator film containing conductive particles, said specific capacitance is the net average electric displacement of a first sign entering into said surface of semiconductor divided by the potential difference between the top of said insulator film containing conductive particles and said place of surface of semiconductor.

4. A surface voltage-sustaining region for a semiconductor device according to claim 1, wherein said surface voltage-sustaining region further comprises one or more sections of thin semiconductor surface layer of second conductivity type or first conductivity type, the concentration and/or the conductivity type of the impurities of said surface thin layer being different from said substrate; said net average electric displacement not only includes the electric displacement generated by the ionized impurities in said thin semiconductor surface layer of said surface voltage-sustaining region, which has a net doping of second conductivity type or first conductivity type, but also the electric displacement of a first sign generated from said insulator film containing conductive particles.

5. A surface voltage-sustaining region for a semiconductor device according claim 1, wherein said semiconductor substrate of first conductivity type is a P-type semiconductor, said semiconductor of second conductivity type is an N-type semiconductor, the sign of net average electric displacement of a first sign is the same as the sign of electric displacement generated by positive charge; and wherein said region having a highest voltage has the highest potential, said region having a lowest voltage has the lowest potential, and said surface voltage-sustaining region transmits positive net average electric displacement to said substrate everywhere.

6. A surface voltage-sustaining region for a semiconductor device according to claim 1, wherein said semiconductor substrate of first conductivity type is an N-type semiconductor, said semiconductor of second conductivity type is a P-type semiconductor, and the sign of net average electric displacement of a first sign is the same with the sign of electric displacement generated by negative charge, and wherein said region having a highest voltage has the lowest potential, said region having a lowest voltage has the highest potential, and said surface voltage-sustaining region absorbs positive net average electric displacement from said substrate everywhere, that is, transmits negative net average electric displacement to said substrate everywhere.

7. A surface voltage-sustaining region for a semiconductor device according to claim 1, said sheet capacitance of said insulator film containing conductive particles decreases gradually or stepwisely from said region having a highest voltage to said region having a lowest voltage.

8. A surface voltage-sustaining region for a semiconductor device according to claim 1, wherein said surface voltage-sustaining region has a section of second conductivity type with impurity density higher than $N_B W_{pp}$ located close to said region having a highest voltage;
   said sheet capacitance of said insulator film containing conductive particles decreases gradually or stepwisely from said region having a highest voltage to said region having a lowest voltage.

9. A surface voltage-sustaining region for a semiconductor device according to claim 1, wherein
   said surface voltage-sustaining region comprising a region of second conductivity type, with impurity density higher than $N_B W_{pp}$ is located between said region having a highest voltage and said region having a lowest voltage;
   said sheet capacitance of said insulator film containing conductive particles increases gradually or stepwisely from said region having a highest voltage toward said region having a lowest voltage; and
   said insulator film containing conductive particles further covers a region connected to said region having a lowest voltage.

10. A surface voltage-sustaining region for a semiconductor device according to claim 1, wherein said surface voltage-sustaining region has a section of second conductivity type with impurity density higher than $N_B W_{pp}$ located close to said region having a highest voltage and has a section of semiconductor region of first conductivity type close to said region having a lowest voltage; said sheet capacitance of said insulator film containing conductive particles increases gradually or stepwisely starting from said region having a highest voltage toward said region having a lowest voltage, and then decreases at a region with a net doping being a first conductivity type close to said region having a lowest voltage.

11. A surface voltage-sustaining region for a semiconductor device according to claim 3, wherein a conductor on the top of a section of said insulator film containing conductive particles is close to said region having a highest voltage and connected to it; said specific capacitance in this section decreases gradually or stepwisely from said region having a highest voltage, while said sheet capacitance of the other portion of said insulator film containing conductive particles with no conductor covered decreases gradually or stepwisely with the distance toward said region having a lowest voltage.

12. A surface voltage-sustaining region for a semiconductor device according to claim 2, wherein said surface voltage-sustaining has a region of second conductivity type with impurity density higher than $N_B W_{pp}$ located between said region having a highest voltage and said region having a lowest voltage;
   said insulator film containing conductive particles is divided into two regions: no conductor is placed on the top of the region close to said region having a highest voltage, and said sheet capacitance in this region increases gradually or stepwisely with the distance from said region having a highest voltage;
   a conductor is placed on the top of the region close to said region having a lowest voltage, and said specific capacitance in this region increases gradually or stepwisely with the distance toward said region having a lowest voltage.

13. A surface voltage-sustaining region for a semiconductor device according to claim 1, wherein the thickness of said insulator film containing conductive particles changes gradually or stepwisely with the distance from said region having a highest voltage.

14. A surface voltage-sustaining region for a semiconductor device according to claim 1, wherein the rate of covering of said insulator film containing conductive particles on the surface of semiconductor changes gradually or stepwisely with the distance from said region having a highest voltage.

15. A surface voltage-sustaining region for a semiconductor device according to claim 1, wherein at least one section of said insulator film containing conductive particles consists of materials with macroscopic permittivity different from other section of said insulator film containing conductive particles.

16. A surface voltage-sustaining region for a semiconductor device according to claim 4, at said surface, which has a certain distance from said region having a highest voltage, at least one section of said insulator film containing conductive particles is located on its top.

17. A semiconductor device, having a semiconductor substrate of first conductivity type and a region having a highest voltage formed by a metal or by a heavily doped semiconductor region of second conductivity type in contact with said substrate and a region having a lowest voltage formed by a metal or by a heavily doped semiconductor region of first conductivity type in contact with said substrate; wherein, said surface voltage-sustaining region according to claim 1 is located at the top of said substrate from said region having a highest voltage to said region having a lowest voltage.

18. A semiconductor device, having a semiconductor substrate of first conductivity type and a region having a highest voltage formed by a metal or by a heavily doped semiconductor region of second conductivity type in contact with said substrate and a region having a lowest voltage formed by a metal or by a heavily doped semiconductor region of first conductivity type in contact with said substrate; wherein, said surface voltage-sustaining region according to claim 1 is located at the top of said substrate from said region having a highest voltage to said region having a lowest voltage; said surface voltage-sustaining region serves as an edge termination outside the active region of said semiconductor device.

19. A thin semiconductor voltage-sustaining region for semiconductor devices, having a region having a lowest voltage formed by a metal or by a heavily doped semiconductor region of first conductivity type, and a region having a highest voltage formed by a metal or by a heavily doped semiconductor region of second conductivity type;
   said thin voltage-sustaining region is located between said region having a highest voltage and said region having a lowest voltage, wherein:
   said thin voltage-sustaining region contains at least one section of said insulator film containing conductive particles on said surface of semiconductor;
   when a reverse voltage close to the breakdown voltage is applied across said region having a highest voltage and said region having a lowest voltage, said thin voltage-sustaining region transmits net average electric displacement to said insulator film containing conductive particles everywhere, said net average electric displacement transmitted is identical to the electric displacement generated by the net doping dose of said thin voltage-sustaining region;

said electric lines transmitted to said insulator film containing conductive particles are eventually absorbed by said metal or by said heavily doped semiconductor region(s) of first or second conductivity type through said insulator film containing conductive particles;

a component of electric field parallel to the direction from said region having a highest voltage to said region having a lowest voltage in said thin voltage-sustaining region is almost constant.

20. A thin semiconductor voltage-sustaining region for a semiconductor device according to claim 19, wherein said insulator film containing conductive particles on said surface of semiconductor has one or multiple section(s) where a conductor is located on its top, said conductor can be electrically floating, fluxes generated by at least one section of said semiconductor surface voltage-sustaining region are transmitted to said conductor through said insulator film containing conductive particles; said conductor emits fluxes into other area of said surface of semiconductor besides said section(s) through said insulator film containing conductive particles.

21. A thin voltage-sustaining region for a semiconductor device according to claim 19, wherein said insulator film containing conductive particles on said surface of semiconductor has one or multiple sections being covered by a conductor, said conductor is electrically connected to a voltage terminal outside said surface voltage-sustaining region, said electric lines transmitted to said insulator film containing conductive particles are eventually absorbed by said conductor.

22. A thin voltage-sustaining region for a semiconductor device according to claim 19, wherein said thin voltage-sustaining region contains at least one or multiple sections of thin layers with net doping being the first conductivity type or the second conductivity type.

23. A semiconductor device, having a region having a lowest voltage formed by a metal or by a heavily doped semiconductor region of first conductivity type, and a region having a highest voltage formed by a metal or by a heavily doped semiconductor region of second conductivity type; wherein:

said semiconductor device also has a thin voltage-sustaining region of said semiconductor device according to claims 19 located between said region having a highest voltage and said region having a lowest voltage.

24. A semiconductor device according to claim 23, wherein one side of said thin surface voltage-sustaining region is covered by said insulator film containing conductive particles, and the other side is in contact with a film with low permittivity and then connected to a thick semi-insulator or a thick insulator layer.

25. A semiconductor device according to claim 23, wherein the two sides of said thin voltage-sustaining region are both covered by said insulator films containing conductive particles.

26. A capacitor, wherein one of the two plates of said capacitor is a metal and the other plate is a semiconductor, said insulator film containing conductive particles is located between said two plates of said capacitor.

* * * * *